US010515179B2

(12) United States Patent
Nishide

(10) Patent No.: US 10,515,179 B2
(45) Date of Patent: Dec. 24, 2019

(54) CIRCUIT DESIGN VERIFICATION APPARATUS AND PROGRAM

(71) Applicant: KABUSHIKI KAISHA TOSHIBA, Tokyo (JP)

(72) Inventor: Takeo Nishide, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 429 days.

(21) Appl. No.: 15/253,517

(22) Filed: Aug. 31, 2016

(65) Prior Publication Data
US 2017/0270234 A1 Sep. 21, 2017

(30) Foreign Application Priority Data
Mar. 15, 2016 (JP) .................................. 2016-051114

(51) Int. Cl.
*G06F 17/50* (2006.01)

(52) U.S. Cl.
CPC ........ *G06F 17/5081* (2013.01); *G06F 17/504* (2013.01); *G06F 17/505* (2013.01); *G06F 17/5022* (2013.01)

(58) Field of Classification Search
CPC ............. G06F 17/5022; G06F 17/5081; G01R 31/31835
See application file for complete search history.

(56) References Cited

U.S. PATENT DOCUMENTS

| 6,959,271 B1* | 10/2005 | Ballam ............... G06F 17/5022 703/14 |
| 7,603,636 B2 | 10/2009 | Yamada |
| 8,060,848 B2 | 11/2011 | Matsuda et al. |
| 2003/0121013 A1* | 6/2003 | Moon ................. G06F 17/5031 716/134 |
| 2006/0271890 A1* | 11/2006 | Hekmatpour ....... G06F 17/5022 716/106 |
| 2010/0115480 A1 | 5/2010 | Isoda |
| 2015/0213173 A1* | 7/2015 | Meyer ................. G06F 17/5022 703/14 |

FOREIGN PATENT DOCUMENTS

| JP | 11-85828 | 3/1999 |
| JP | 4255079 B2 | 4/2009 |
| JP | 2010-113395 A | 5/2010 |
| JP | 5287092 B2 | 9/2013 |

* cited by examiner

*Primary Examiner* — Vuthe Siek
*Assistant Examiner* — Aric Lin
(74) *Attorney, Agent, or Firm* — Kim & Stewart LLP

(57) ABSTRACT

A program embodied in a non-transitory computer readable medium includes instructions executable by a processor to perform a method of verifying a circuit design. The method includes the steps of performing an automated analysis of the circuit design by scanning an assertion description file and a signal list file of the circuit design, creating and displaying a scheme based on the assertion description file, wherein the scheme includes nodes and arcs, the nodes indicating output signals and the arcs indicating a transition relationship between nodes, and identifying in the scheme assertions that are missing from the assertion description, and recommending amendments to the assertion description to supply the missing assertions, the missing assertions, when added, being reflected in the display of the scheme.

5 Claims, 9 Drawing Sheets

FIG. 3A
penable && pready |=> !penable
(OUTPUT    (INPUT    (OUTPUT
SIGNAL)   SIGNAL)   SIGNAL)
FIG. 3B
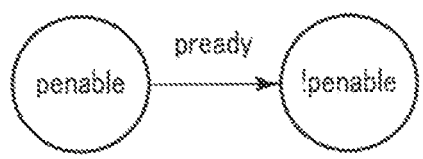
FIG. 4A
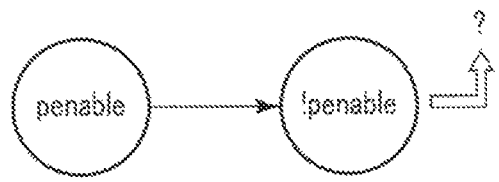
FIG. 4B
Additional Assertion:
!penable && XXXX |=> YYYY

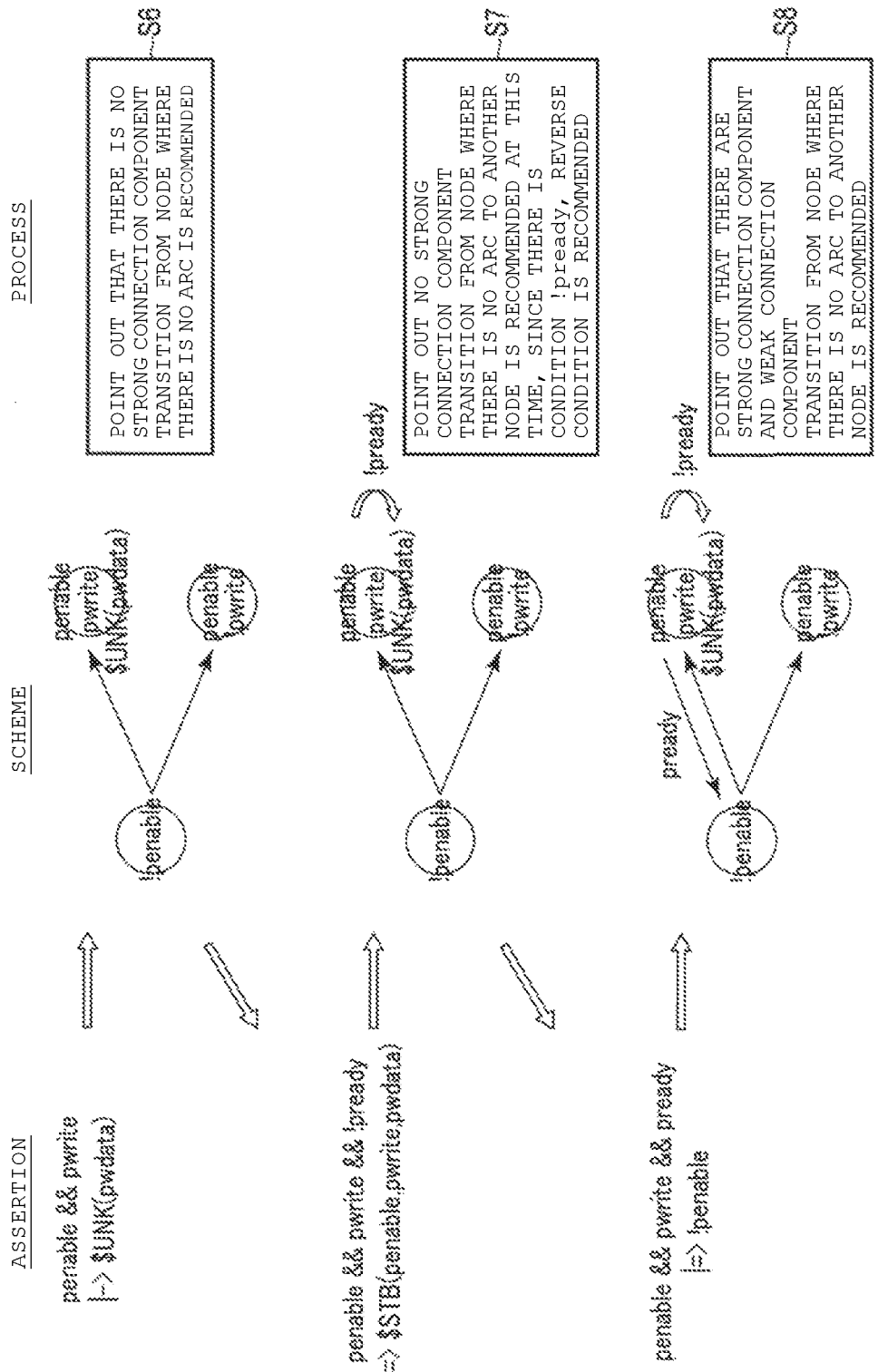

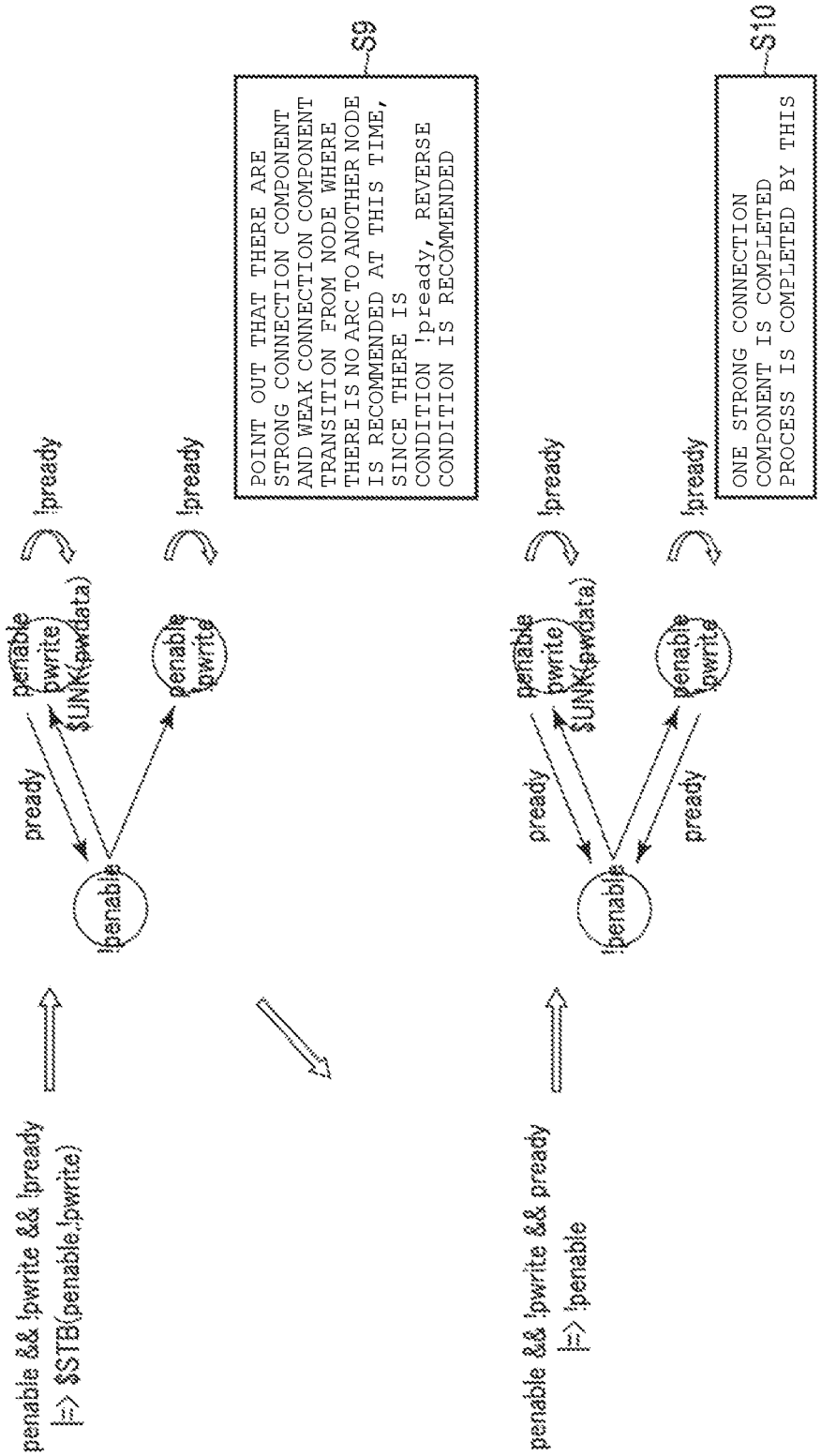

FIG. 9

| No. | 1 | 2 | 3 | 4 | 5 | 6 | 7 | 8 | 9 |
|---|---|---|---|---|---|---|---|---|---|
| CONDITIONS | !preset_n | !psel && !penable | psel && !penable | psel && !penable && pwrite | psel && penable | psel && penable && pwrite | penable && !pready | penable && !pready && pwrite | penable && pready && psel |
| imply | |-> | |-> | |-> | |-> | |-> | |-> | |=> | |=> | |=> |
| psel | !psel | | psel | | | | $STB(psel) | | |
| penable | !penable | !penable | penable | | | | penable | | !penable |
| pwrite | | | $STB(pwrite) | | $UNK(pwrite) | | $STB(pwrite) | | |
| paddr | | | $STB(paddr) | | $UNK(paddr) | | $STB(paddr) | | |
| pwdata | | | $norelation | $STB(pwdata) | | $UNK(pwdata) | | $STB(pwdata) | |

CIRCUIT DESIGN VERIFICATION APPARATUS AND PROGRAM

CROSS-REFERENCE TO RELATED APPLICATION

This application is based upon and claims the benefit of priority from Japanese Patent Application No. 2016-051114, filed Mar. 15, 2016, the entire contents of which are incorporated herein by reference.

FIELD

Embodiments described herein relate generally to a circuit design verification apparatus and a program.

BACKGROUND

In the field of electrical circuit design, the operation of the circuit may be defined using assertions which define transitions of various output signals of the circuit is created.

Generally, since it is unlikely that a complete set of assertions can be defined prior to design of the circuit, designers use some type of a support tool. Commonly, a support tool displays a signal name when detecting a signal name that is not covered in the assertions, or a support tool in which a coverage degree (coverage) of the assertions is obtained and displayed based on the signal name.

Even in the case where the support tools are used, there may be missing assertions are not detected, or a situation where a designer is not aware of missing assertions.

DESCRIPTION OF THE DRAWINGS

FIG. 3A and FIG. 3B are diagrams illustrating an example of a scheme that is created and displayed by the circuit design verification apparatus according to the embodiment.

FIG. 4A and FIG. 4B are diagrams illustrating an example of the scheme that is created and displayed by the circuit design verification apparatus according to the embodiment, and in which information pointing out lack of assertion is accompanied.

FIG. 7 is a diagram illustrating an example of a part of a specific operation by the circuit design verification apparatus according to the embodiment.

FIG. 8 is a diagram illustrating an example of a part of a specific operation by the circuit design verification apparatus according to the embodiment.

FIG. 9 is a diagram illustrating an example of a table that is created and displayed by the circuit design verification apparatus according to the embodiment.

DETAILED DESCRIPTION

Embodiments provide a circuit design verification apparatus and a program capable of preventing failure to detect assertions that are missing, and easily creating an assertion description containing the assertions, including the missing assertions.

According to one embodiment, a program embodied in a non-transitory computer readable medium includes instructions executable by a processor to perform a method of verifying a circuit design. The method includes the steps of performing an automated analysis of the circuit design by scanning an assertion description file and a signal list file of the circuit design, creating and displaying a scheme based on the assertion description file, wherein the scheme includes nodes and arcs, the nodes indicating output signals and the arcs indicating a transition relationship between nodes, and identifying in the scheme assertions that are missing from the assertion description, and recommending amendments to the assertion description to supply the missing assertions, the missing assertions, when added, being reflected in the display of the scheme.

Hereinafter, an embodiment is described with reference to the drawings.

Figure 1:
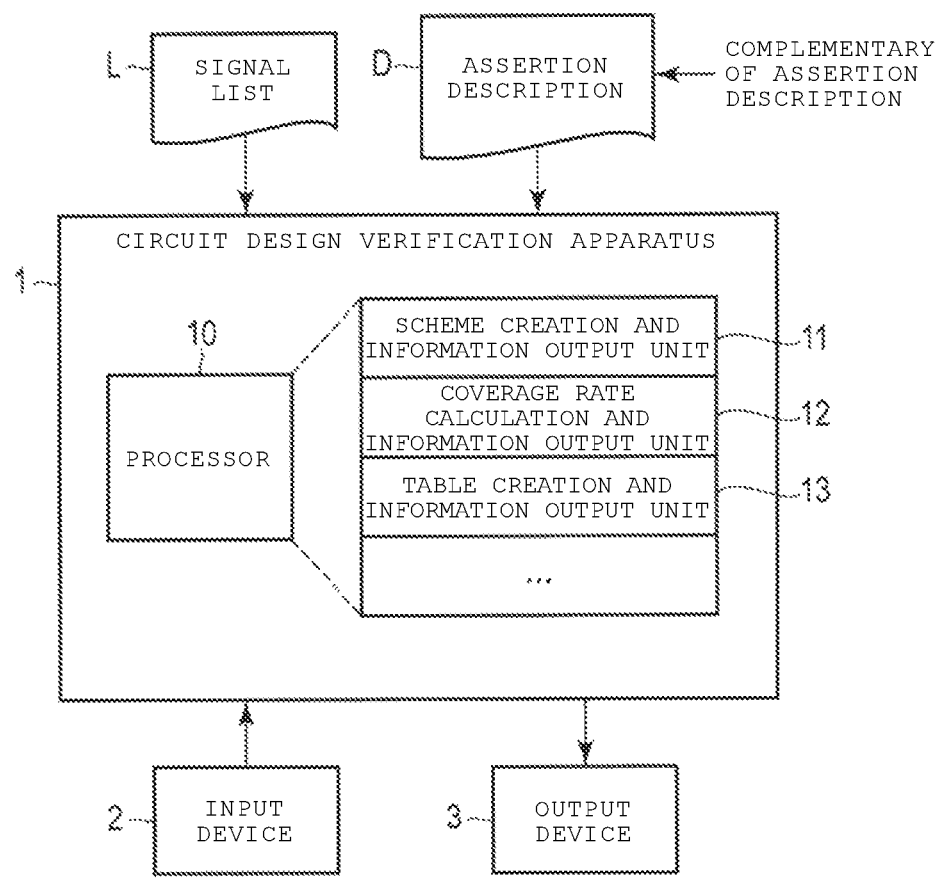
FIG. 1 is a diagram illustrating an example of a configuration of a circuit design verification apparatus according to an embodiment.

FIG. 1 is a block diagram illustrating an example of a configuration of a circuit design verification apparatus according to the embodiment.

A circuit design verification apparatus 1 illustrated in FIG. 1 is to verify an assertion description of a circuit configuring a semiconductor apparatus, and is achieved by using, for example, a computer.

The circuit design verification apparatus 1 includes an input device 2 and an output device 3, and has a built-in processor 10. The input device 2 corresponds to, for example, a keyboard, a mouse, or the like. The output device 3 corresponds to, for example, a display device such as a display and the like. The processor 10 executes a predetermined program and realizes various functions including a scheme creation and information output unit 11, a coverage rate calculation and information output unit 12, and a table creation and information output unit 13 described below.

For example, the circuit design verification apparatus 1 can capture an assertion description D and a signal list L created by the designer, perform verification of the assertion description D while using the signal list L, display various pieces of information including a verified result on the output device 3, and perform various processes in response to an input operation in the input device 2 by the designer. In addition, the circuit design verification apparatus 1 can capture the assertion description D after updating, and repeat a process for the verification of the assertion description D or an output of the verified result, whenever an update (for example, complementary of assertion description D according to addition of new assertion) of the assertion description D is performed by the designer.

Figure 2:
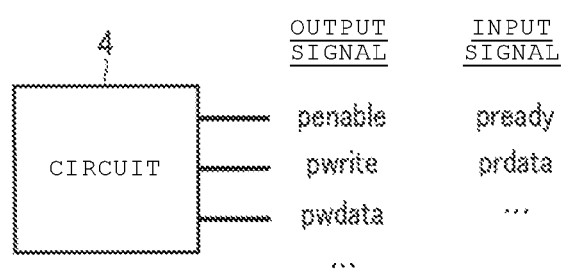
FIG. 2 is a diagram illustrating a circuit for inputting and outputting signals such as commands, data, and the like that conform to a predetermined specification.

For example, the assertion description D is a description of one or a plurality of assertions in a stage which is created or in the course of being created by the designer targeting a circuit 4 that inputs and outputs signals such as commands, data, and the like that conform to a predetermined specification, as illustrated in FIG. 2. The signal list L is a list including information illustrating types (or signal name) of output signals and input signals used in the circuit 4.

As types of the main output signal (control signal and data signal) and the input signal (control signal and data signal) used in the circuit 4 of FIG. 2, the following is noted.

1 Output Signals
penable
pwrite
pwdata
psel
paddr
$unknown (hereinafter, referred to as "$UNK")
$stable (hereinafter, referred to as "$STB")

The "penable" is an enable signal in a state in which data transfer can be performed. The "pwrite" is a signal which becomes a write access when high, and becomes a read access when low. The "pwdata" is write data which is transferred when the "pwrite" is high. The "psel" is a select signal indicating that it is selected. The "paddr" is an address signal indicating an address. The "$UNK" is a signal indicating X (undefined) among four values (0, 1, X (undefined), and Z (high impedance)). The "$STB" is a signal indicating that the previous value is held.

2 Input Signals
pready
prdata

The "pready" is a ready signal. The "prdata" is read data to be transferred when the "pwrite" is low.

The above-described scheme creation and information output unit 11 has a scheme creation function for creating a scheme (sometimes referred to as "graph") in which a state of one or a plurality of signals in one cycle is represented as one node and transition of a state of a signal between cycles is represented as a connection (sometimes referred to as "arc") between unidirectional nodes based on the assertion description D of the circuit 4.

In addition, the scheme creation and information output unit 11 has an information output function for displaying the scheme created by the scheme creation function on the output device 3, and displaying information pointing out the lack of the assertion with the scheme on the output device 3 when at least the lack of connection is generated in the scheme.

The coverage rate calculation and information output unit 12 has a first coverage rate output function for calculating a ratio of the number of existing assertions with respect to the sum of the number of assertions existing in the assertion description D and the number of assertions which are pointed out as missing, and outputting information in which the ratio is set as an assertion coverage rate (first assertion coverage rate) on the output device 3.

The table creation and information output unit 13 includes a table creation output function for creating a table which includes a plurality of cells that are configured by combining a column or a row in which information indicating a signal type of the output signal used in the circuit 4 is arranged, and a row or a column in which information indicating a condition described in the left side of each assertion is arranged, and in which an expected operation described in the right side of each assertion is recorded in a cell positioned at the same column and row as that of a corresponding output signal and a corresponding condition, and displaying information indicating the created table on the output device 3.

In addition, the coverage rate calculation and information output unit 12 has a second coverage rate output function for calculating a ratio of a cell in which the expected operation or a specific symbol "$norelation" described below is described with respect to the plurality of cells, and displaying information in which the ratio is set as the assertion coverage rate (second assertion coverage rate) on the output device 3, based on the table created by the table creation and information output unit 13.

It is possible for the above program to cause a computer to execute various functions including the scheme creation and information output unit 11, the coverage rate calculation and information output unit 12, and the table creation and information output unit 13.

1 Scheme Creation and Information Output Unit 11

Next, with reference to FIG. 3A and FIG. 3B, the scheme created and displayed by the scheme creation function of the scheme creation and information output unit 11 is described. FIG. 3A illustrates an example of a particular assertion, and FIG. 3B illustrates an example of the scheme created by corresponding to the assertion.

In the example of the assertion illustrated in FIG. 3A, "penable && pready", "|=>", and "!penable" are sequentially described from the left. In this example, if the input signal "ready" returns, when the output signal of a target is the "penable" in a certain cycle, a state (state of "penable" is released and returned to its initial state) which becomes the "!penable" is displayed in the next cycle. Here, the "|=>" indicates a state change in the next cycle. A case of "|->" instead of "|=>" indicates a state change within the same cycle. In addition, the left side of "|=>" indicates a condition relating to the output signal of the target, and the right side indicates the expected operation thereof. The "&&" is a symbol to be written together in a case where another input signal or an output signal as a condition is described along with the output signal of the target.

In the example of the scheme illustrated in FIG. 3B, two nodes are displayed, and one arc indicating a transition relationship is present between these two nodes. The arc corresponds to the transition relationship "|=>", a node connected to a start point of the arc corresponds to the left side of the "|=>", and a node connected to an end point of the arc corresponds to the right side of the "|=>". In this example, the output signal "penable" is arranged to correspond to the node connected the start point of the arc, the input signal "pready" is arranged to correspond to the arc, and the "!penable" is arranged to correspond to the node that becomes the end point of the arc. However, the input signal "pready" may not be arranged to correspond to the arc, and may be arranged to correspond to the node that becomes the start point of the arc.

The scheme creation function of the scheme creation and information output unit 11 performs an analysis of a description content by examining each assertion from the assertion description D, and creates a scheme in accordance with a certain rule, whenever the assertion description D is updated.

For example, if the transition relationship "|->" is in the assertion description D, a signal name described on the right side is added and arranged on the node on which a signal name described in the left side is arranged. If the transition relationship "|=>" is in the assertion description D, a new node is created and arranged, a signal name described in the right side is displayed thereon, and, further, an arc that connects the node on which the signal name described in the left side is displayed and the newly created node is newly created and displayed.

In addition, when "!$UNK ( . . . )" is in the assertion description D and a signal " . . . " to be a target thereof is the control signal, the signal thereof " . . . " becomes a value which is not X (undefined), that is, a value of "0" or "1", and since a flow of a subsequent process is changed according to one of "0" and "1", a node on which the "!$UNK ( . . . )" is expanded in two ways. This is referred to as a UNK expansion. For example, in a case of the "!$UNK (pwrite)", the node on which the "!$UNK (pwrite)" is separated into a node on which the "pwrite" is displayed and a node on which the "!pwrite" is displayed and the separated nodes are then connected.

In addition, even when the "|=>" is in the assertion description D, if "$STB ( . . . )" is in the right side thereof, a new node or arc is not created. The signal " . . . " to be a target thereof is maintained on the display of the existing node on which the signal name described in the left side is displayed.

Next, with reference to FIG. 4A, FIG. 4B, FIG. 5A, and FIG. 5B, an overview of the scheme in accordance with the information displayed by the information output function of the scheme creation and information output unit 11 and pointing out the lack of the assertion is described.

Figures 5A, 5B:
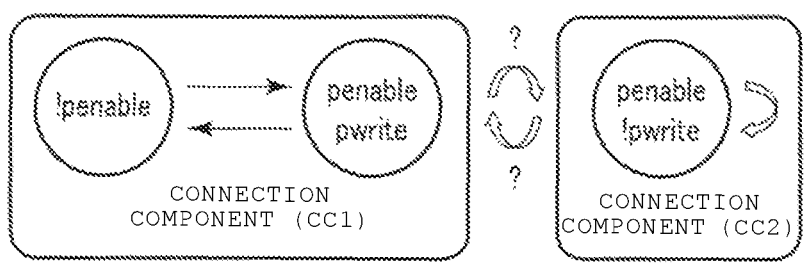
FIG. 5A and FIG. 5B are diagrams illustrating an example of the scheme that is created and displayed by the circuit design verification apparatus according to the embodiment, and in which the information pointing out lack of the assertion is accompanied.

FIG. 4A/FIG. 4B and FIG. 5A/FIG. 5B illustrate two examples of a display screen including information pointing out a missing assertion and recommending the addition of the assertion that is also missing.

Hereinafter, a case where there is only one connection between the nodes is referred to as a "weak connection", and a case where there are two connections with different directions between the nodes is referred to as a "strong connection". In addition, a collection of the connected node groups (or one node with no connection) is regarded as one "connection component". Specifically, the collection of the node groups connected by only the "strong connection" is referred to as a "strong connection component". In the embodiment, until the "strong connection component" in the scheme is present, a process pointing out the lack of the assertion and a process recommending the addition of the assertion that is missing are repeatedly performed.

The information output function of the scheme creation and information output unit 11 displays the information pointing out the lack of the assertion in accordance with the scheme, in a case where there is a node at which a connection to another node is missing, and displays the information recommending the addition of the assertion that is missing.

For example, as illustrated in FIG. 4A, in a case where there is a connection between the nodes in the scheme, but the connection is not the "strong connection", the information output function of the scheme creation and information output unit 11, for example, displays a mark or the like in which "→" and "?" indicating there is no arc from the node on which the "!penable" is displayed to another node, together with the scheme, as the information pointing out the missing the assertion.

At the same time, as illustrated in FIG. 4B, the information output function of the scheme creation and information output unit 11 creates and displays one assertion candidate defining transition from the node where there is no arc to another node. By presenting information such as FIG. 4B, it is possible for designers to easily grasp and create the assertion that is missing.

In addition, as illustrated in FIG. 5A, in the scheme, even in a case where there is the connection component 1 (CC1) that is a "strong connection component", in a case where there is another connection component 2 (CC2) not connected to the connection component 1, the information output function of the scheme creation and information output unit 11, for example, displays a mark or the like such as "→" and "?" indicating the lack of two arcs having different connection directions connecting between the connection component 1 (CC1) and the connection component 2 (CC2) along with the scheme, as the information pointing out the lack of the assertion. At this time, a surrounding line illustrated to easily understand the scope of each of the connection components is also displayed together with the scheme.

At the same time, as illustrated in FIG. 5B, the information output function of the scheme creation and information output unit 11 creates and displays candidates of two assertions which define, respectively, transition from the connection component 1 (CC1) to the connection component 2 (CC2), and transition from the connection component 2 (CC2) to the connection component 1 (CC1). By presenting the information such as FIG. 5B, it is possible for designers to easily grasp and create the assertion that is missing.

The information output function of the scheme creation and information output unit 11 repeatedly performs the process pointing out the lack of the assertion and the process recommending the addition of the assertion that is missing, until the there is only a "strong connection component" in the scheme, even in a case where there is the "strong connection component" according to the connection component 1 (CC1), as illustrated in FIG. 5B.

Next, the scheme creation and information output unit 11 operation according to procedures of (1) to (3) is illustrated as follows.

(1) For every assertion that is described, the addition of the scheme (addition of node, arc, signal name, and the like, or UNK expansion and the like) according to content thereof is performed.

(2) The scheme is analyzed, and if there is a missing connection, the omission is pointed out and the addition of a corresponding assertion is recommended. In addition, if there is a missing signal name (for example, there is "pready" but no "!pready", there is "!pready" but no "pready", or the like), the lack thereof is pointed out and the addition of a corresponding assertion is recommended.

(3) If a scheme of only one strong connection component is not completed, the above steps (1) and (2) are repeated. On the other hand, if the scheme is completed, the process ends.

Figure 6:
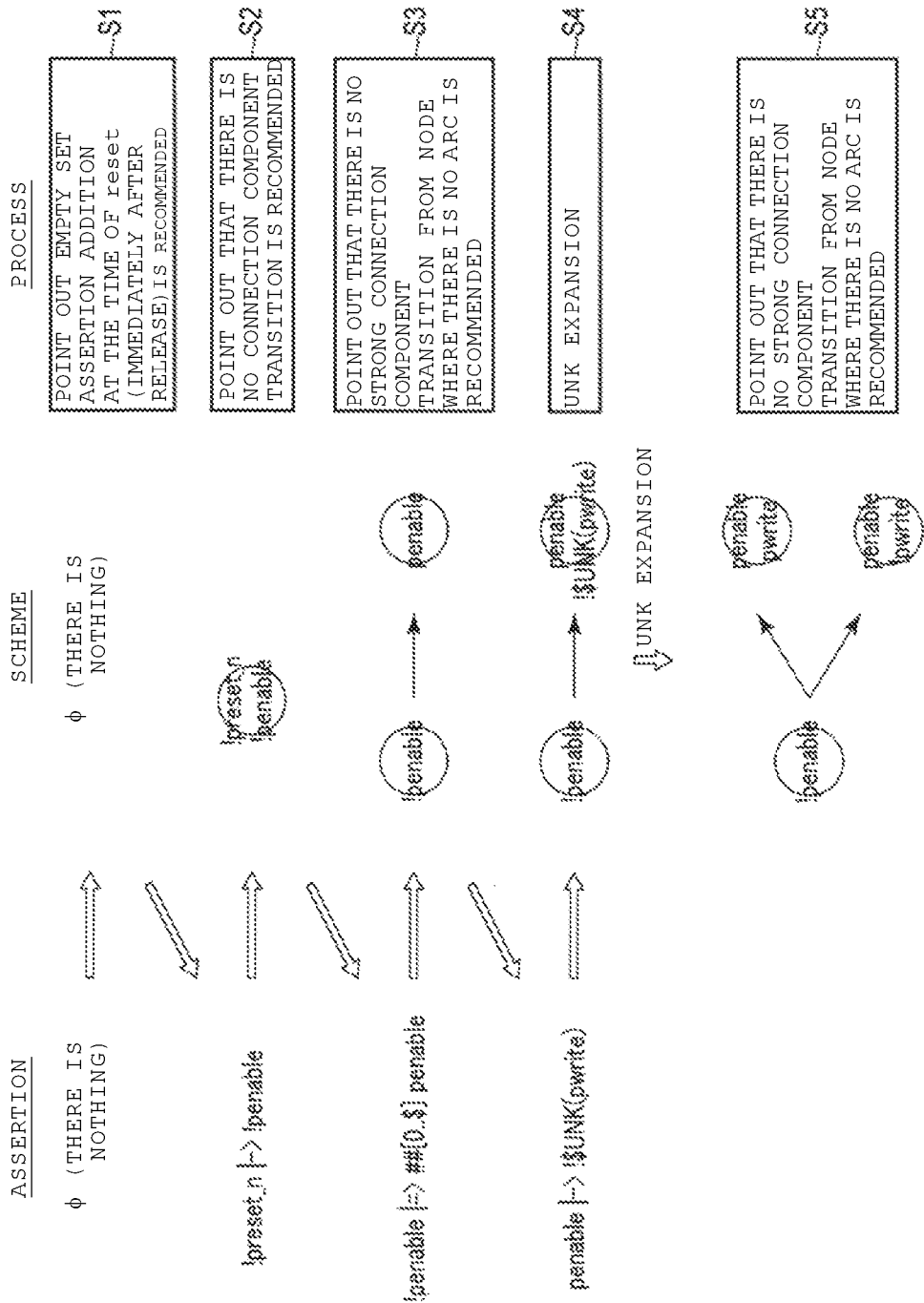
FIG. 6 is a diagram illustrating an example of a part of a specific operation by the circuit design verification apparatus according to the embodiment.

Next, with reference to FIG. 6 to FIG. 8, an example of a specific operation according to the scheme creation and information output unit 11 is described.

In the embodiment, even in a case where there is no assertion in the assertion description D, the scheme creation and information output unit 11 recommends an input operation to the designer so that the designer can proceed with the design.

For example, as illustrated in FIG. 6, if it is in a state where there is no description of assertion (state of empty set), there is no scheme. The scheme creation and information output unit 11 points out a state of empty set where there is no description of the assertion, and recommends the addition of the assertion at the time of reset (immediately after release), through the display screen of the output device 3 (step S1).

According to this, for example, the designer adds the next assertion to the assertion description D, through the input device 2.

In a case of !preset_n|->!penable, the scheme creation and information output unit 11 creates and displays a new node on the display screen of the output device 3, as a scheme, and displays "!preset_n" and "!penable" thereon (in scheme presented below, in order to avoid frequency of description, description of the above "preset_n" is omitted). Here, the scheme creation and information output unit 11 points out that there is a node where there is no arc to another node, and recommends the addition of the assertion defining a transition from the node, through the display screen of the output device 3 (step S2).

In response to this, for example, the designer adds the next assertion to the assertion description D, through the input device 2.

In a case of !penable |=>## [0 . . . $] penable, the scheme creation and information output unit 11 creates and displays a new node on the display screen of the output device 3, as the scheme, displays the "penable" thereon, and newly creates and displays an arc that connects the nodes. Here, the scheme creation and information output unit 11 points out that there is no strong connection component, and recommends the addition of the assertion defining the transition from the node (node on which penable is arranged) where there is no arc to another node, through the display screen of the output device 3 (step S3).

According to this, for example, the designer adds the next assertion to the assertion description D, through the input device 2.

In a case of penable |->!$UNK (pwrite), the scheme creation and information output unit 11 displays the "!$UNK (pwrite)" on the node on which the "penable" is displayed, in the display screen of the output device 3. In a case of the "!$UNK (pwrite)", since a flow of a subsequent process is changed according to any one of "0" and "1" of the value of the "pwrite", the scheme creation and information output unit 11 expands the node on which the "!$UNK (pwrite)" is displayed, displaying the nodes by separating the nodes into a node on which the "pwrite" is displayed and a node on which the "!pwrite" is displayed, and also separates the existing arc into two arcs according to the expansion (step S4). The scheme creation and information output unit 11 also points out that there is no strong connection component (two amounts), through the display screen of the output device 3, and recommends the addition of the assertion corresponding to the transition from two nodes (node on which "pwrite" is arranged and node on which "!pwrite" is arranged) where there are no arcs (step S5).

According to this, for example, the designer adds the next assertion to the assertion description D, through the input device 2, (see FIG. 7).

In a case of penable && pwrite |->$UNK (pwdata), the scheme creation and information output unit 11 displays the "$UNK (pwdata)" on the node on which "penable" and "pwrite" are arranged, in the display screen of the output device 3. Here, the scheme creation and information output unit 11 points out that there are the strong connection component and the weak connection component (i.e., there is a component which is not a strong connection component), through the display screen of the output device 3, and recommends the addition of the assertion corresponding to the transition from the node (two amounts) where there is no arc to another node (step S6).

According to this, for example, the designer adds the next assertion to the assertion description D, through the input device 2.

In a case of penable &&pwrite && !pready |=>$STB (penable, pwrite, pwdata), the scheme creation and information output unit 11 displays an additional signal "!pready" with respect to the node on which the "penable", the "pwrite", and the "$UNK (pwdata)" are displayed, in the display screen of the output device 3. Since the "$STB" means that the previous value is held, there is no change in the "penable", the "pwrite", and the "pwdata". Here, the scheme creation and information output unit 11 points out that there are the strong connection component and the weak connection (i.e., there is a component which is not a strong connection component), through the display screen of the output device 3, and recommends the addition of the assertion corresponding to the transition from the node (two) where there is no arc to another node. In addition, at this time, since "pready" that is the reverse condition of the added "!pready" is not present, the addition of the assertion including the "pready" is recommended (step S7).

According to this, for example, the designer adds the next assertion to the assertion description D, through the input device 2.

In a case of penable && pwrite && pready |=>!penable, the scheme creation and information output unit 11 displays an additional signal "pready", and newly creates and displays an arc that connects corresponding nodes, in the display screen of the output device 3. Here, the scheme creation and information output unit 11 points out that there are the strong connection component and the weak connection (i.e., there is a component which is not a strong connection component), through the display screen of the output device 3, and recommends the addition of the assertion corresponding to the transition from the node (node where "penable" and "!pwrite" are displayed) where there is no arc to another node (step S8).

According to this, for example, the designer adds the next assertion to the assertion description D, through the input device 2 (see FIG. 8).

In a case of penable && !pwrite && !pready |=>$STB (penable, !pwrite), the scheme creation and information output unit 11 displays an additional signal "!pready" with respect to the node on which the "penable" and the "!pwrite" are displayed, in the display screen of the output device 3. Since the "$STB" means that the previous value is held, there is no change in the "penable" and the "!pwrite". Here, the scheme creation and information output unit 11 points out that there are the strong connection component and the weak connection (i.e., there is a component which is not a strong connection component), through the display screen of the output device 3, and recommends the addition of the assertion corresponding to the transition from the node (node where "penable" and "!pwrite" are arranged) where there is no arc to another node. In addition, at this time, since the "pready" that is the reverse condition of the added "!pready" is not present, the addition of the assertion including the "pready" is recommended (step S9).

According to this, for example, the designer adds the next assertion to the assertion description D, through the input device 2.

In a case of penable && !pwrite && pready |=>!penable, the scheme creation and information output unit 11 displays an additional signal "pready" and newly creates and displays an arc that connects corresponding nodes at the same time, in the display screen of the output device 3. Here, as the strong connection between entire nodes is formed, the scheme creation and information output unit 11 notifies that there is no assertion that is missing and ends the process recommending the addition of the assertion, in the display screen of the output device 3 (step S10).

In the embodiment, since it is possible to reliably detect the assertion that is missing and recommend the addition of the assertion that is missing to the designer at the same time, through the scheme created in this way, it is possible to prevent the detection failure of the assertion that is missing, and prevent a situation that the designer does not notice a missing the assertion.

2 Details of Function of Coverage Rate Calculation and Information Output Unit 12

Next, the first assertion coverage rate calculated and displayed by the coverage rate calculation and information output unit 12 is described.

The first assertion coverage rate indicates a ratio at which assertion required in the assertion description D is covered, and is calculated by using, for example, the number of assertions existing in the assertion description D and the number of missing assertions which are pointed out by the above-described scheme creation and information output unit 11. For example, in the above-described case of FIG. 4A/FIG. 4B, it is considered that one assertion defining the transition from the node where there is no arc to another node is insufficient, and the number of missing assertions is counted as "1". In addition, in the above-described case of FIG. 5A/FIG. 5B, it is considered that two assertions respectively defining transition from the connection component 1 (CC1) to the connection component 2 (CC2) and the transition from the connection component 2 (CC2) to the connection component 1 (CC1) are insufficient, and then the number of missing assertions is counted as "2".

If the number of the assertions present in the assertion description D is "Ne", and the number of missing assertions which are pointed out by the scheme creation and information output unit 11 is "Nd", the first assertion coverage rate is represented, for example, as follows.

$$\text{(assertion coverage rate)} = Ne/(Ne+Nd) \tag{1}$$

The assertion coverage rate may be expressed as a percentage.

The coverage rate calculation and information output unit 12 displays information indicating the temporal change of such an assertion coverage rate or the temporal change of the denominator and numerator thereof on the display screen of the output device 3.

By displaying the information indicating such an assertion coverage rate on the display screen of the output device 3, the designer can easily grasp the degree of the completion of the assertion description D, and also easily perform creation of the assertion description D.

3 Details of Function of Table Creation and Information Output Unit 13

Next, with reference to FIG. 9, a table created and displayed by the table creation and information output unit 13 is described.

FIG. 9 is a diagram illustrating an example of the table created and displayed on the display screen of the output device 3 by the table creation and information output unit 13.

Here, a state of a table is illustrated at the time when the designer begins to create the assertion description D and before the assertion description D is completed.

As illustrated in FIG. 9, items 21 indicating all of the signal types of the output signal used in the circuit 4 are arranged in the first column of the table, respectively. However, here, in order to simplify the description, signal types fewer than actual signal types are illustrated. In the example of FIG. 9, five signals of "psel", "penable", "pwrite", "paddr", and "pwdata" are illustrated as the signal types of the output signal.

In addition, items 22 indicating conditions described in the left side of each of the assertions are respectively arranged in the first row of the table, and items 23 indicating a symbol between the left side and the right side of each of the assertions which is anyone of "->" and "|=>", are arranged in the second row. By combining the row or the column in which these items are arranged, 5 rows×9 columns=45 cells are configured.

The table creation and information output unit 13 disposes all of the output signals used in the circuit 4 in the first column of the table, based on a signal list L illustrated in FIG. 1.

In addition, the table creation and information output unit 13 extracts each assertion from the assertion description D whenever the assertion description D is updated, displays all of the conditions and the symbol ("->" or "|=>") described in the left side of each of the assertions in the first row and second row of the table, respectively, and records all of the expected operations described in the right side of each of the assertions in the cells that are positioned at the same column and row as a corresponding output signal and a corresponding condition. As a result, in the example of the table of FIG. 9, a state where the expected operations described in the right side of each of the assertions are respectively described in the 17 cells among the 45 cells is illustrated.

Among the 45 cells, the designer performs a predetermined input operation with respect to a certain cell in which the expected operation is not recorded. Accordingly, it is possible to record a symbol of the "$norelation" indicating that the output signal in the items 21 arranged in the same row as a corresponding cell is irrelevant with respect to a condition in the items 22 arranged at the same column as the corresponding cell. When a predetermined input operation is performed with respect to a blank cell to which the expected operation is not recorded, the table creation and information output unit 13 records and displays the "$norelation" in the cell.

In addition, the table creation and information output unit 13 also has a function of recording and displaying the "$norelation" in a corresponding cell, when a specific assertion declaring that a certain output signal is irrelevant with respect to a certain condition in the assertion description D exists. The specific assertion, for example, is described in the assertion description D as follows.

A |->$norelation (B)

The assertion indicates that B is irrelevant with respect to A.

Since the designer can easily grasp that a location where the "$norelation" is displayed in each cell of the table is already checked and a location where nothing is displayed is in a state of unreviewed, it is possible for the designer to easily grasp the degree of the completion of the assertion description D, and also easily perform the creation of the assertion description D.

Here, the calculation of the second assertion coverage rate based on the table of FIG. 9 is described.

When the number of conditions described in the items 22 is Nc, the number of the output signals described in the items 21 is No, the number of the expected operations recorded in the cell is Nr, and the number of the $norelation recorded in the cell is Nn, the second assertion coverage rate is represented, for example, as follows.

$$\text{(assertion coverage rate)} = (Nr+Nn)/(Nc+No) \tag{2}$$

In the example of the table of FIG. 9, since Nc=9 and No=5, (Nc+No) of the denominator becomes 45. In addition, since Nr=17 and Nn=1, (Nr+Nn) of the numerator becomes 18.

The assertion coverage rate may be represented as a percentage.

The coverage rate calculation and information output unit 12 displays information indicating the temporal change of such an assertion coverage rate or the temporal change of the denominator and numerator thereof on the display screen of the output device 3.

By displaying the information indicating such an assertion coverage rate on the display screen of the output device 3, the designer can easily grasp the degree of the completion of the assertion description D, and also easily perform the creation of the assertion description D.

Figure 10A:
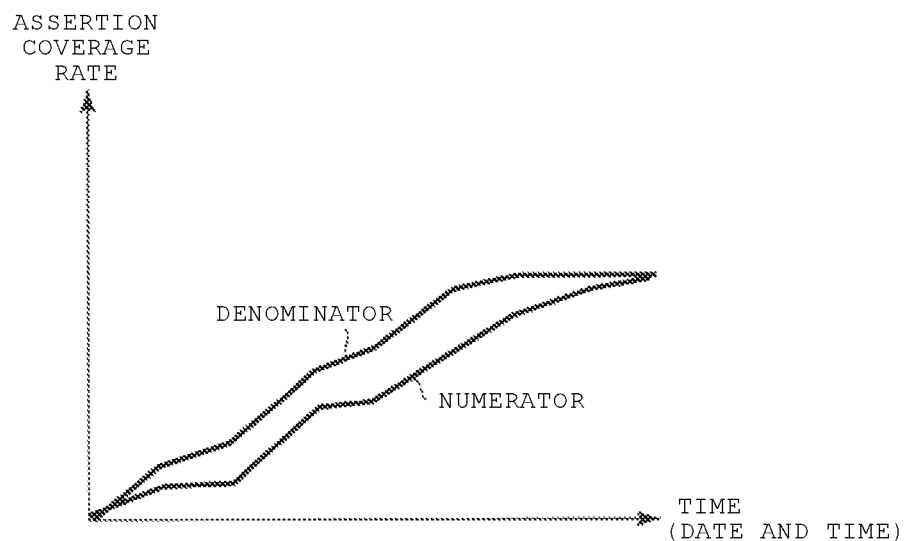
FIG. 10A and FIG. 10B are diagrams illustrating examples of a temporal change of each of a first assertion coverage rate and a second assertion coverage rate that are created and displayed by the circuit design verification apparatus according to the embodiment are compared.
Figure 10B:
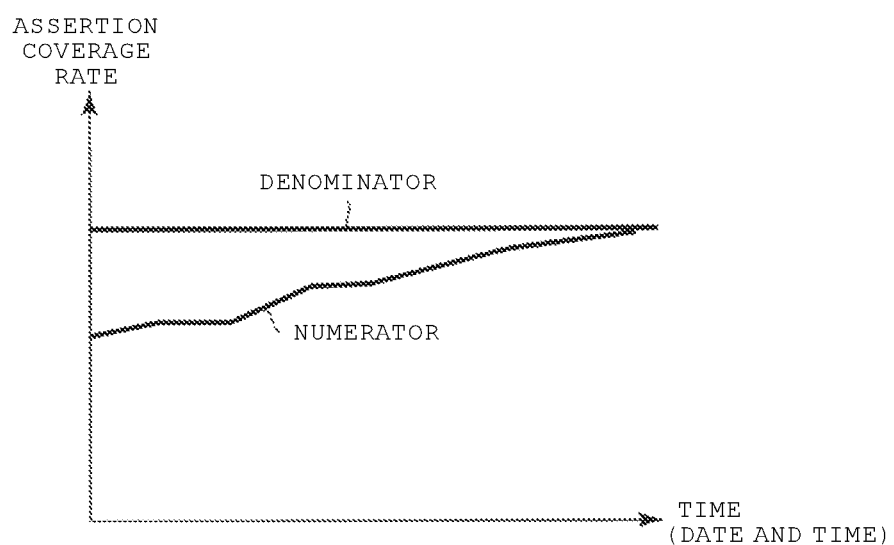

In FIGS. 10A and 10B, respectively, examples of the temporal change in each of the first assertion coverage rate by the above-described Equation (1) and the second assertion coverage rate by the above-described Equation (2) are compared and illustrated.

In the first assertion coverage rate by the above Equation (1), as illustrated in FIG. 10A, there is a tendency that the numerical value of the denominator and the numerical value of the numerator gradually increase in the process from the creation of the assertion description D by the designer to the completion thereof.

Meanwhile, in the second assertion coverage rate by the above Equation (2), as illustrated in FIG. 10B, there is a tendency that the numerical value of the denominator is not changed in the process from the creation of the assertion description D by the designer to the completion thereof, and the numerical value of the numerator gradually increases in the process from the creation of the assertion description D by the designer to the completion thereof.

In either case, since the lack of the assertion is frequently generated for a while after the start of the creation of the assertion description D, the numerical of the numerator becomes a value smaller than the numerical value of the denominator and the assertion coverage rate becomes a relatively lower value. When the lack of the assertion gradually decreases by adding the assertion, the numerical value of the numerator becomes gradually a value closer to the numerical value of the denominator and the assertion coverage rate increases. At the time of completing the assertion description D, the numerical value of the denominator and the numerical value of the numerator coincide, and the assertion coverage rate becomes 1 (or 100%).

Figure 11:
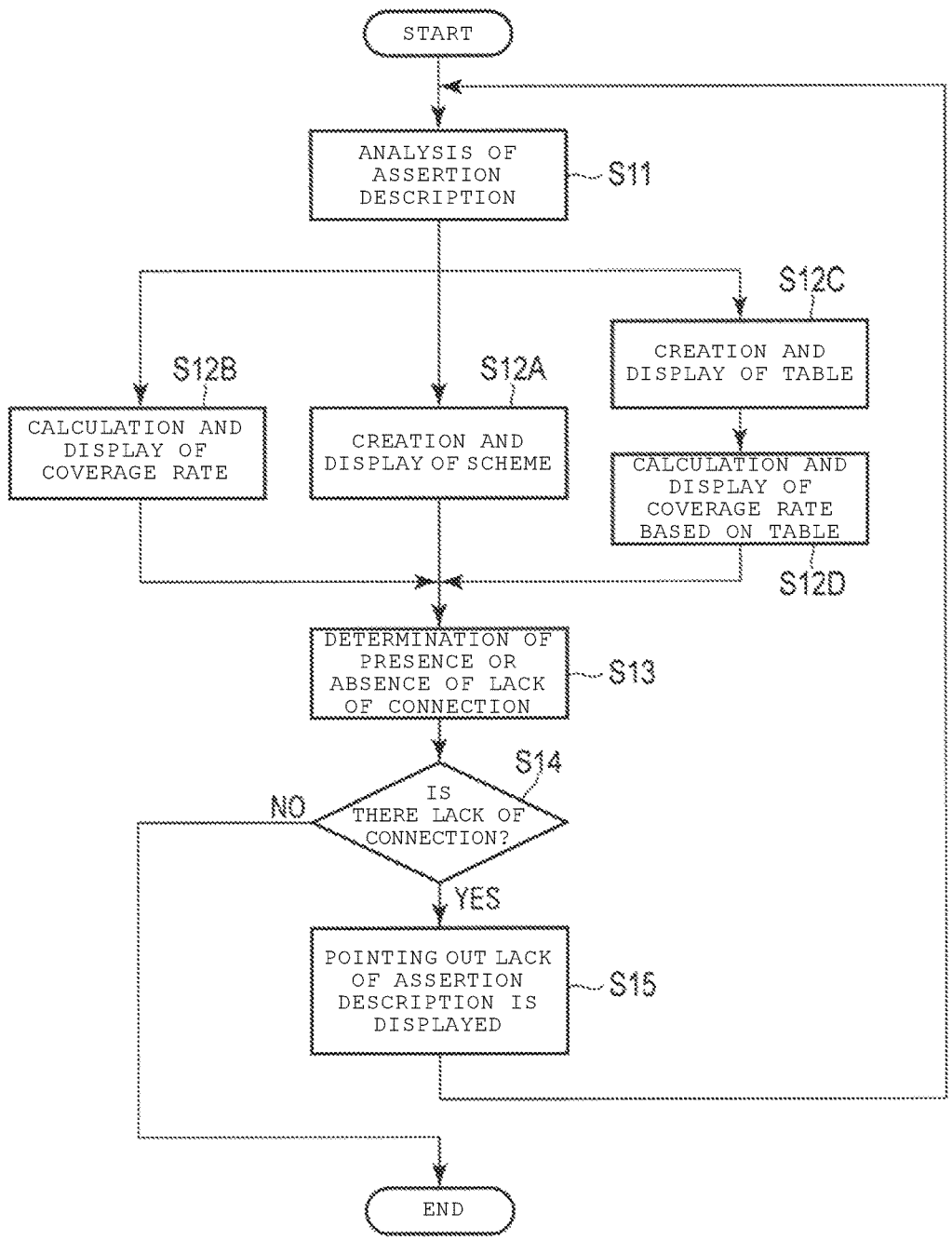
FIG. 11 is a diagram illustrating an example of an operation by the circuit design verification apparatus according to the embodiment.

Next, with reference to FIG. 11, an example of an operation by the circuit design verification apparatus 1 of the embodiment will be described.

The circuit design verification apparatus 1 captures the assertion description D, whenever the signal list L is captured and the assertion description D is updated, and performs analysis of description content by examining each assertion from the assertion description D thereof (step S11).

Next, the circuit design verification apparatus 1 creates the scheme (graph) corresponding to each assertion that is described, based on an analysis result of the assertion description D, and displays the created scheme on the output device 3 (step S12A).

In addition, the circuit design verification apparatus 1 calculates a ratio of the number of the existing assertions with respect to the sum of the number of assertions existing in the assertion description D and the number of the assertions of which the lack is pointed out, based on an analysis result of the assertion description D, by using, for example, the above-described Equation (1), and displays the information in which the ratio is set as the assertion coverage rate on the output device 3 (step S12B).

In addition, for example, the circuit design verification apparatus 1 creates the table illustrated in FIG. 9, based on an analysis result of the signal list L and the assertion description D, and displays the information illustrating the created table on the output device 3 (step S12C). When a predetermined input operation is performed with respect to a blank cell in which the expected operation is not recorded among a plurality of cells in the table that is displayed, the circuit design verification apparatus 1 records and indicates the "$norelation" in the cell.

Furthermore, the circuit design verification apparatus 1 calculates a ratio of a cell in which an expected operation or the specific symbol "$norelation" described below is described with respect to the plurality of cells, by using, for example, the above-described Equation (2) based on the created table, and outputs the information in which the ratio is set as the assertion coverage rate (step S12D).

Next, the circuit design verification apparatus 1 verifies whether or not there is an issue to be pointed out such as the lack of connection (or lack of signal names) and the like in the scheme in which the creation and display in step S12A are performed (step S13).

Here, if there is an issue to be pointed out such as the lack of connection (or lack of signal names) and the like (YES of step S14), the information pointing out the fact thereof is displayed on the output device 3 (step S15), and the process from step S11 is repeated.

Meanwhile, if there is no issue to be pointed out such as the lack of connection (or lack of signal names) and the like (NO of step S14), the process is completed.

Steps S12B, S12C, and S12D are not essential processes, and can be omitted.

In the embodiment, since it is possible to reliably detect the assertion that is lacked through the scheme that is created, and to recommend the addition of the assertion that is lacked to the designer, it is possible to prevent the detection failure of the assertion that is missing, and prevent a situation in which the designer does not notice the lack of the assertion.

In addition, in the embodiment, since the information indicating the temporal change of such an assertion coverage rate or the temporal change of the denominator and numerator thereof are displayed on the display screen, the designer can easily grasp the degree of the completion of the assertion description D, and also easily perform the creation of the assertion description D.

In addition, in the embodiment, since the table in which the relationship of the output signal used in the circuit, and a condition of each assertion and the expected operation is shown is displayed on the display screen, the degree of the completion of the assertion description D can be easily grasped, and the creation of the assertion description D can be easily performed.

According to the embodiment as described above, it is possible to prevent the detection failure of the assertion that is missing, and easily perform the creation of the assertion description.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit design verification apparatus, comprising:
a processor; and
a memory coupled to the processor and containing a program that when executed by the processor causes the processor to:
   scan an assertion description file of a circuit design and a signal list file of the circuit design,
   based on the assertion description file and the signal list file, generate and display a graph including nodes corresponding to output signals and arcs corresponding to a transition relationship between nodes,
   identify assertions that are missing from the assertion description file, and generate recommended amendments to the assertion description file to supply the missing assertions, and
   receive a user input for indicating acceptance of a recommended amendment and include the recommend amendment in the graph when the user input indicates acceptance, wherein
a missing assertion is identified by the processor by detecting a node in the graph having no arcs connected thereto.

2. The circuit design verification apparatus according to claim 1, wherein identifying assertations that are missing from the assertion description file includes expanding a signal that is declared unknown and displaying the expansion as multiple nodes in the graph, each having a value that is a subset of unknown.

3. The circuit design verification apparatus according to claim 1, wherein the program, when executed by the processor, further causes the processor to:
   generate an estimate of coverage.

4. The circuit design verification apparatus according to claim 1, wherein the program, when executed by the processor, further causes the processor to:
   generate and display a table indicating a lack of coverage.

5. The circuit design verification apparatus according to claim 1, wherein the program, when executed by the processor, further causes the processor to:
   receive user input indicating an identified missing assertion is to be added to the assertation description file; and
   update the assertation description file to include the identified missing assertion.

* * * * *